(12) United States Patent
Lee et al.

(10) Patent No.: US 11,558,031 B2
(45) Date of Patent: Jan. 17, 2023

(54) FILM BULK ACOUSTIC RESONATOR AND METHOD OF MANUFACTURING THE SAME

(71) Applicant: Samsung Electro-Mechanics Co., Ltd., Suwon-si (KR)

(72) Inventors: Tae Kyung Lee, Suwon-si (KR); Jin Suk Son, Suwon-si (KR); Sung Sun Kim, Suwon-si (KR); Je Hong Kyoung, Suwon-si (KR); Hwa Sun Lee, Suwon-si (KR); Ran Hee Shin, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 884 days.

(21) Appl. No.: 15/808,662

(22) Filed: Nov. 9, 2017

(65) Prior Publication Data

US 2018/0262180 A1    Sep. 13, 2018

(30) Foreign Application Priority Data

Mar. 8, 2017   (KR) .................. 10-2017-0029254
Apr. 7, 2017   (KR) .................. 10-2017-0045078

(51) Int. Cl.
*H03H 9/17*   (2006.01)
*H01L 41/16*   (2006.01)
(Continued)

(52) U.S. Cl.
CPC ............... *H03H 9/17* (2013.01); *H01L 41/16* (2013.01); *H01L 41/183* (2013.01);
(Continued)

(58) Field of Classification Search
CPC .................................. H03H 9/17; H01L 41/16
See application file for complete search history.

(56) References Cited

U.S. PATENT DOCUMENTS 10,009,007 B2 * 6/2018 Lee .................. H03H 9/173
10,608,164 B2   3/2020 Umeda et al.
(Continued)

FOREIGN PATENT DOCUMENTS

CN    1395752 A   2/2003
CN    1574617 A   2/2005
(Continued)

OTHER PUBLICATIONS

Hongyan Liu et al., *Enhancement of piezoelectric response of diluted Ta doped AlN*, China National Knowledge Infrastructure, pp. 1-6, Jan. 2013 (6 pages in English).
(Continued)

*Primary Examiner* — Shawki S Ismail
*Assistant Examiner* — Karen B Addison
(74) *Attorney, Agent, or Firm* — NSIP Law (57) ABSTRACT

A film bulk acoustic resonator includes: a first electrode disposed on a substrate; a piezoelectric body disposed on the first electrode and including AlN to which a dopant is added; and a second electrode disposed on the piezoelectric body and facing the first electrode such that the piezoelectric body is interposed between the second electrode and the first electrode, wherein the dopant includes either one of 0.1 to 24 at % of Ta and 0.1 to 23 at % of Nb.

7 Claims, 8 Drawing Sheets

(51) Int. Cl.
  *H01L 41/39* (2013.01)
  *H01L 41/29* (2013.01)
  *H01L 41/187* (2006.01)
  *H03H 3/02* (2006.01)
  *H03H 9/02* (2006.01)
  *H01L 41/18* (2006.01)

(52) U.S. Cl.
  CPC ............ *H01L 41/187* (2013.01); *H01L 41/29* (2013.01); *H01L 41/39* (2013.01); *H03H 3/02* (2013.01); *H03H 9/02015* (2013.01); *H03H 9/173* (2013.01); *H03H 2003/021* (2013.01)

(56) References Cited

U.S. PATENT DOCUMENTS

| | | | |
|---|---|---|---|
| 2003/0030118 A1 | 2/2003 | Kim | |
| 2004/0256961 A1 | 12/2004 | Namba et al. | |
| 2005/0093397 A1* | 5/2005 | Yamada | H03H 9/02102 310/320 |
| 2006/0158283 A1 | 7/2006 | Hikita et al. | |
| 2007/0013268 A1 | 1/2007 | Kubo et al. | |
| 2007/0115078 A1* | 5/2007 | Sano | H03H 9/605 333/187 |
| 2007/0284971 A1 | 12/2007 | Sano et al. | |
| 2008/0296529 A1 | 12/2008 | Akiyama et al. | |
| 2010/0283537 A1 | 11/2010 | Forbes et al. | |
| 2013/0049544 A1* | 2/2013 | Yokoyama | H01L 41/187 310/365 |
| 2013/0241673 A1 | 9/2013 | Yakoyama et al. | |
| 2014/0167560 A1 | 6/2014 | Onda | |
| 2015/0280100 A1 | 10/2015 | Burak et al. | |
| 2016/0254438 A1 | 9/2016 | Umeda et al. | |
| 2016/0300996 A1* | 10/2016 | Lee | H03H 9/605 |
| 2016/0373083 A1 | 12/2016 | Lee et al. | |

FOREIGN PATENT DOCUMENTS

| | | |
|---|---|---|
| CN | 101280412 A | 10/2008 |
| CN | 105765751 A | 7/2016 |
| CN | 106257831 A | 12/2016 |
| JP | 2006-203304 A | 8/2006 |
| JP | 2009-55128 A | 3/2009 |
| JP | 2009-100464 A | 5/2009 |
| JP | 5190841 B2 | 4/2013 |
| JP | 2015-54986 A | 3/2015 |
| JP | 2015-198450 A | 11/2015 |
| JP | 5904591 B2 | 4/2016 |
| JP | 5932168 B2 | 6/2016 |
| JP | 5957376 B2 | 7/2016 |
| KR | 10-0725010 B1 | 6/2007 |

OTHER PUBLICATIONS

Enrique Iborra et al., *Piezoelectric and Electroacoustic Properties of V-Doped and Ta-Doped AlN Thin Films*, IEEE, pp. 262-265, Jan. 2014 (4 pages in English).

Chinese Office Action dated Jun. 7, 2021 issued in counterpart Chinese Patent Application No. 201810027856.6 (16 pages in English)(11 pages in Chinese).

Chinese Office Action dated Dec. 6, 2021 in corresponding Chinese Patent Application No. 201810027856.6. (15 pages in English and 11 pages in Chinese).

* cited by examiner

FILM BULK ACOUSTIC RESONATOR AND METHOD OF MANUFACTURING THE SAME

CROSS-REFERENCE TO RELATED APPLICATIONS

This application claims the benefit under 35 U.S.C. § 119(a) of Korean Patent Application Nos. 10-2017-0029254 and 10-2017-0045078 filed on Mar. 8, 2017 and Apr. 7, 2017, respectively, in the Korean Intellectual Property Office, the entire disclosures of which are incorporated herein by reference for all purposes.

BACKGROUND

1. Field

The following description relates to a film bulk acoustic resonator and a method of manufacturing a film bulk acoustic resonator.

2. Description of Related Art

Recently, in accordance with the rapid development of mobile communications devices and chemical and biological devices, demand for a small, light filter, an oscillator, a resonant element, and an acoustic resonant mass sensor used in such devices, has increased.

A film bulk acoustic resonator (FBAR) is known as a member implementing the small and light filter, the oscillator, the resonant element, and the acoustic resonant mass sensor.

The FBAR may be mass-produced at minimal cost, and may be implemented to have a subminiature size. In addition, the FBAR may implement a high quality factor (Q) value, which is a main characteristic of a filter, may be used even in a microwave frequency band, and may particularly implement bands of a personal communications system (PCS) and a digital cordless system (DCS).

In general, the FBAR includes a resonant part implemented by sequentially stacking a first electrode, a piezoelectric body, and a second electrode on a substrate.

In operation of the FBAR, when electric energy is applied to the first and second electrodes to induce an electric field in a piezoelectric layer, the electric field generates a piezoelectric phenomenon in the piezoelectric layer to allow the resonant part to vibrate in a predetermined direction. As a result, bulk acoustic waves are generated in the same direction as the direction in which the resonant part vibrates, thereby generating resonance.

That is, in the FBAR, an effective electromechanical coupling coefficient Kt2 of the piezoelectric body is increased, such that frequency characteristics of an acoustic wave element may be improved and an increase in a band is also possible.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a film bulk acoustic resonator includes: a first electrode disposed on a substrate; a piezoelectric body disposed on the first electrode and including AlN to which a dopant is added; and a second electrode disposed on the piezoelectric body and facing the first electrode such that the piezoelectric body is interposed between the second electrode and the first electrode, wherein the dopant includes either one of 0.1 to 24 at % of Ta and 0.1 to 23 at % of Nb.

A weight percent content of either one of Ta and Nb in the piezoelectric body may be less than a weight percent content of Al in the piezoelectric body.

In a case in which the dopant includes Ta, the piezoelectric body may include AlN and AlTaN. In a case in which the dopant includes Nb, the piezoelectric body may include AlN and AlNbN.

The piezoelectric body may not include either one of TaN and NbN.

Either one of the first electrode and the second electrode may include a conductive metal and an added element, and the added element may include either one of Ta and Nb.

The added element may be the same as the dopant.

Either one of the first electrode and the second electrode may include a conductive metal and an added element, and the added element may include either one of Ta and Nb in an amount of 0.1 to 30 at %.

In another general aspect, a method to manufacture a film bulk acoustic resonator includes: forming a first electrode on a substrate; forming a piezoelectric body on the first electrode by sputtering, under a nitrogen atmosphere, a single target including either one of AlTa including 0.1 to 24 at % of Ta and AlNb including 0.1 to 23 at % of Nb; and forming a second electrode on the piezoelectric body to face the first electrode such that the piezoelectric body is interposed between the second electrode and the first electrode.

A weight percent content of either one of Ta and Nb included in the single target may be less than a weight percent content of Al included in the single target.

In a case in which the single target includes AlTa, the piezoelectric body may include AlN and AlTaN. In a case in which the single target includes AlNb, the piezoelectric body may include AlN and AlNbN.

The piezoelectric body may not include either one of TaN and NbN.

In the forming of the first electrode, the first electrode may include a conductive metal and an added element that includes either one of Ta and Nb. In the forming of the second electrode, the second electrode may include the conductive metal and the added element that includes either one of Ta and Nb.

In the forming of the first electrode, the first electrode may include Ta in a case in which the single target includes AlTa, or may include Nb in a case in which the single target includes AlNb. In the forming of the second electrode, the second electrode may include Ta the case in which the single target includes AlTa, or may include Nb in the case in which the single target includes AlNb.

In the forming of the first electrode, the first electrode may include a conductive metal and an added element that includes either one of Ta and Nb in an amount of 0.1 to 30 at %. In the forming of the second electrode, the second electrode may include the conductive metal and the added element that includes either one of Ta and Nb in the amount of 0.1 to 30 at %.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," "coupled to," "over," or "covering" another element, it may be directly "on," "connected to," "coupled to," "over," or "covering" the other element, or there may be one or more other elements intervening therebetween. In contrast, when an element is described as being "directly on," "directly connected to," "directly coupled to," "directly over," or "directly covering" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, embodiments will be described in detail with reference to the accompanying drawings.

Film Bulk Acoustic Resonator

Figure 1A:
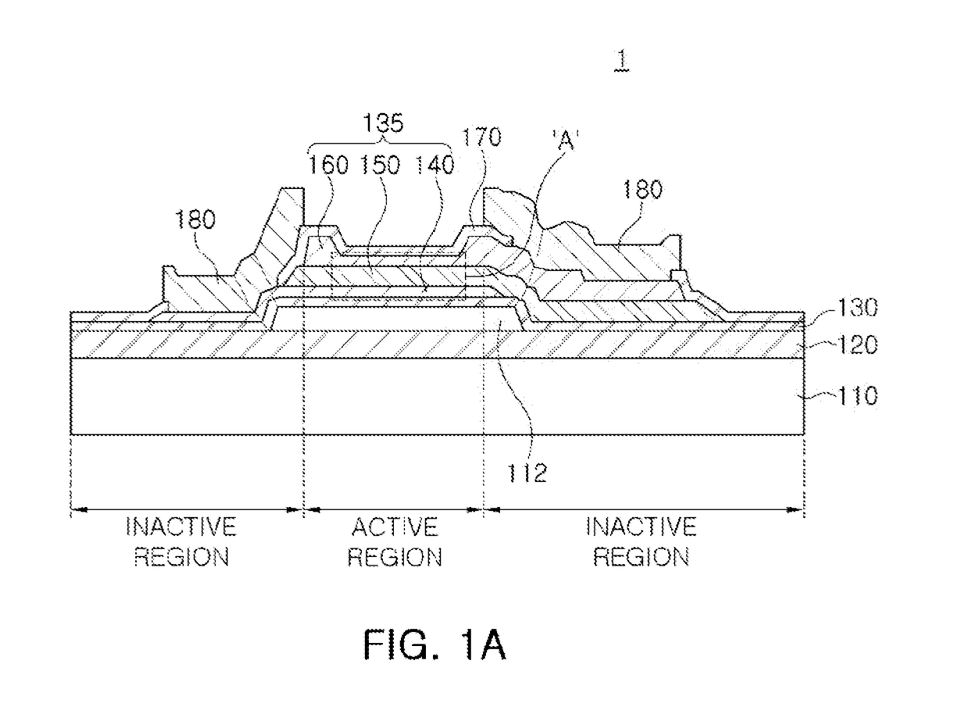
FIGS. 1A and 1B are schematic cross-sectional views illustrating film bulk acoustic resonators, according to an embodiments.
Figure 1B:
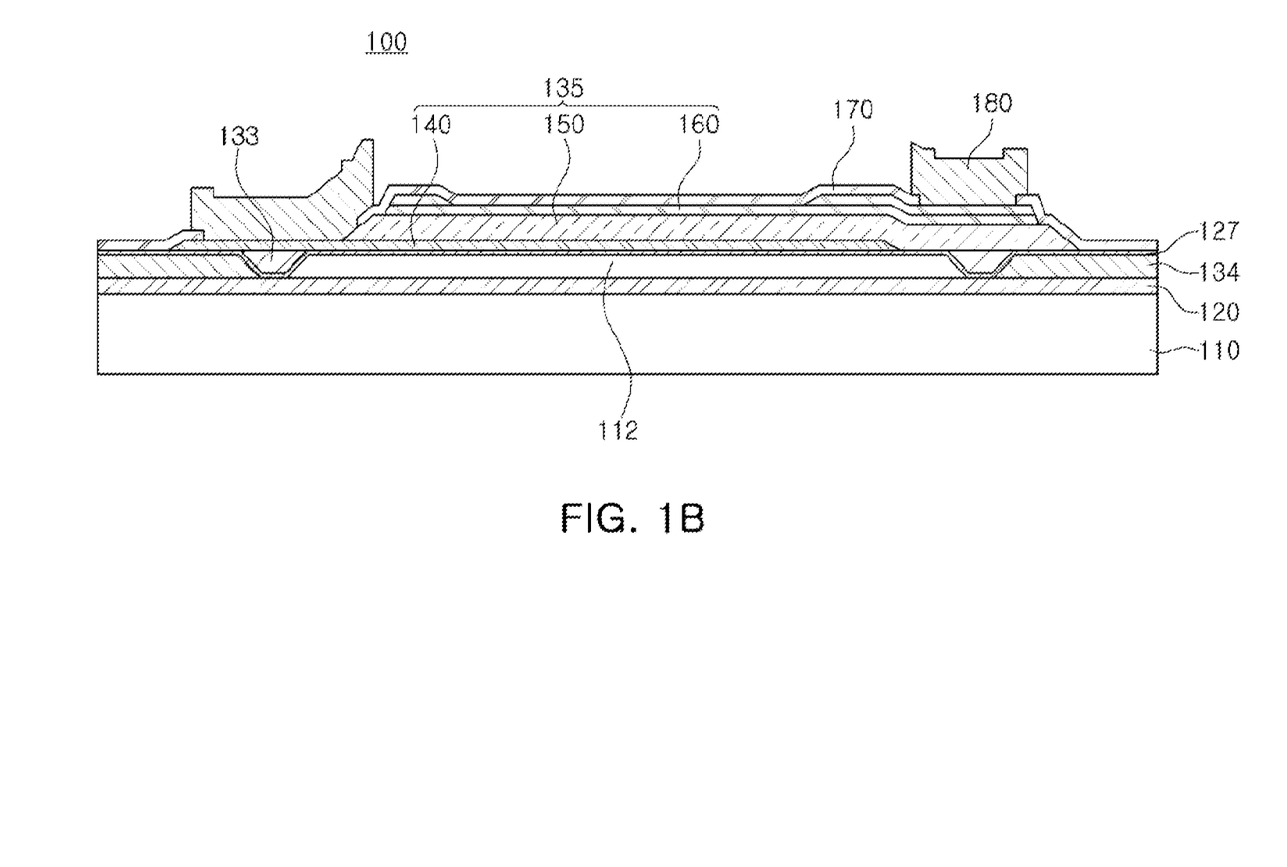
Figure 2:
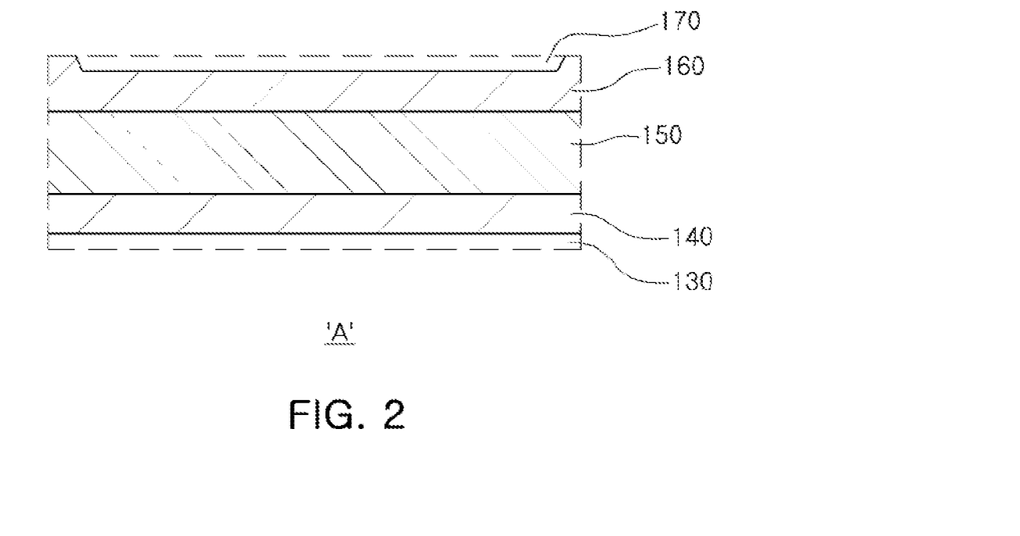
FIG. 2 is a schematic enlarged view of part A of FIG. 1A.

FIGS. 1A and 1B are schematic cross-sectional views illustrating film bulk acoustic resonators 1 and 100, according to an embodiments. FIG. 2 is a schematic enlarged view of part A of FIG. 1A.

Referring to FIG. 1A, the film bulk acoustic resonator (FBAR) 1 includes a substrate 110, an insulating layer 120, an air cavity 112, and a resonant part 135.

The substrate 110 may be a silicon substrate, and the insulating layer 120 is provided on an upper surface of the substrate 110 to electrically isolate the substrate 110 and the resonant part 135 from each other.

The insulating layer 120 includes any one or any combination of any two or more of a silicon dioxide ($SiO_2$), a silicon nitride ($Si_3N_4$), an aluminum oxide ($Al_2O_3$), and an aluminum nitride (AlN), but is not limited to such examples. The insulating layer 120 may be formed on the substrate 110 by performing chemical vapor deposition, radio frequency (RF) magnetron sputtering, or evaporation using any one or any combination of any two or more of a silicon dioxide ($SiO_2$), a silicon nitride ($Si_3N_4$), an aluminum oxide ($Al_2O_3$), and an aluminum nitride (AlN).

The air cavity 112 is disposed on the substrate 110. The air cavity 112 is positioned below the resonant part 135 so that the resonant part 135 can vibrate in a predetermined direction. The air cavity 112 may be formed by processing a membrane 130 by a predetermined process. The membrane 130 may be an oxidation protecting film, or may be a protecting layer protecting the substrate 110. The membrane 130 may be formed of any one or any combination of any two or more of $SiO_2$, $Si_3N_4$, AlN, and $Al_2O_3$. Although not illustrated in FIG. 1A, a seed layer formed of an aluminum nitride (AlN) may be formed on the membrane 130. In detail, the seed layer may be disposed between the membrane 130 and a first electrode 140. The seed layer may also be formed using a dielectric material or a metal having a hexagonal closest packing (HCP) structure, in addition to AlN. In a case in which the seed layer is formed of the metal, the seed layer may be formed of Ti, for example.

Also, an etch stop layer may be additionally formed on the insulating layer 120. The etch stop layer protects the substrate 110 and the insulating layer 120 from the etching process for removing a sacrificial layer pattern, and is a base for depositing several other layers on the etch stop layer.

The resonant part 135 includes the first electrode 140, a piezoelectric body 150, and a second electrode 160. The first electrode 140, the piezoelectric body 150, and the second electrode 160 are sequentially stacked.

The first electrode 140 is extended from an upper portion of one region of the insulating layer 120 to the membrane 130 above the air cavity 112. The piezoelectric body 150 is formed on the first electrode 140 on the air cavity 112. The second electrode 160 is extended from an upper portion of the other region of the insulating layer 120 onto the piezoelectric body 150 above the air cavity 112. A common region of the first electrode 140, the piezoelectric body 150, and the second electrode 160 overlapping one another in a vertical direction is positioned above the air cavity 112.

The resonant part 135 includes an active region and an inactive region. The active region of the resonant part 135, which is a region vibrating and resonating in a predetermined direction by a piezoelectric phenomenon generated in the piezoelectric body 150 in response to electric energy such as a radio frequency signal being applied to the first electrode 140 and the second electrode 160, is a region in which the first electrode 140, the piezoelectric body 150, and the second electrode 160 overlap one another in the vertical direction above the air cavity 112. The inactive region of the resonant part 135, which is a region that does not resonate by the piezoelectric phenomenon even through the electric energy is applied to the first and second electrodes 140 and 160, is a region outside the active region.

The resonant part 135 outputs radio frequency signals having a specific frequency by the piezoelectric phenomenon. In detail, the resonant part 135 outputs radio frequency signals having a resonant frequency corresponding to vibrations depending on the piezoelectric phenomenon of the piezoelectric body 150.

A protection layer 170 is disposed on the second electrode 160 of the resonant part 135 to prevent the second electrode 160 from being externally exposed and oxidized, and electrode pads 180 for applying electrical signals are formed on portions of the first electrode 140 and the second electrode 160 that are externally exposed.

The piezoelectric body 150, which generates a piezoelectric effect of converting electric energy into mechanical energy having an acoustic wave form, may include aluminum nitride (AlN) to which a dopant is added.

In the related art, a rare earth metal is used as the dopant, and the rare earth metal used as the dopant is, for example, any one of scandium (Sc), erbium (Er), yttrium (Y), and lanthanum (La). However, the rare earth metal is very expensive due to scarcity, such that an entire cost required for manufacturing a film bulk acoustic resonator is increased.

Therefore, another dopant capable of providing piezoelectric characteristics that are equal to or better than those provided by the rare earth metal dopant, and capable of reducing a cost required for the film bulk acoustic resonator is desired.

FIG. 1B is a cross-sectional view illustrating a film bulk acoustic resonator according 100, to another embodiment.

Referring to FIG. 1B, the film bulk acoustic resonator 100 is similar to the film bulk acoustic resonator 1 illustrated in FIG. 1A. Therefore, a description for contents of the film bulk acoustic wave resonator 100 that are the same as or overlap those of the film bulk acoustic resonator 1 will be omitted, and contents different from those of the film bulk acoustic resonator 1 will be mainly described.

Referring to FIG. 1B, the air cavity 112 is formed in an approximately trapezoidal shape, such that cracks may be formed in the first electrode 140, the piezoelectric body 150, the second electrode 160, and the electrode pads 180 stacked on the membrane 130 by a height of the air cavity 112 and an angle of side surfaces of the air cavity 112, and crystals of the piezoelectric body 150 stacked on the membrane 130 may be abnormally grown. Insertion loss characteristics and attenuation characteristics of the film bulk acoustic resonator may be deteriorated due to the cracks and the abnormal growth of the crystals of the piezoelectric body 150.

Referring to FIG. 1B, the film bulk acoustic resonator 100 includes the substrate 110, the air cavity 112, the insulating layer 120, a support part 133, an auxiliary support part 134, and the resonant part 135, and further includes the protecting layer 170 and the electrode pads 180.

The insulating layer 120, which electrically isolates the resonant part 135 from the substrate 110, is be provided on an upper surface of the substrate 110. The film bulk acoustic resonator 100 further includes the etch stop layer disposed on the insulating layer 120. The etch stop layer protects the substrate 110 and the insulating layer 120 from an etching process, and is a base for depositing layers or films on the etch stop layer.

The insulating layer 120 and the etch stop layer may be separately formed, or may be integrated as one layer. When the insulating layer 120 and the etch stop layer are integrated as one layer, the insulating layer 120 and the etch stop layer may be implemented using an oxide layer.

The air cavity 112, the support part 133, and the auxiliary support part 134 are formed on the etch stop layer.

The air cavity 112 may be formed by forming a sacrificial layer on the etch stop layer, forming a pattern for providing the support part 133 on the sacrificial layer, stacking the first electrode 140, the piezoelectric layer 150, and the second electrode 160, and then etching and removing the sacrificial layer by an etching process. As an example, the sacrificial layer includes poly-silicon (poly-Si). The air cavity 112 is positioned below the resonant part 135 including the first electrode 140, the piezoelectric layer 150, and the second electrode 160, so that the resonant part 135 can vibrate in a predetermined direction.

The support part 133 and the auxiliary support part 134 are provided outside the air cavity 112. Thicknesses of the air cavity 112, the support part 133, and the auxiliary support part 134 formed on the etch stop layer may be the same as one another. Therefore, one surface provided by the air cavity 112, the support part 133, and the auxiliary support part 134 is approximately flat. According to another embodiment, the resonant part 135 is disposed on a flat surface from which a step is removed, resulting in improvement of insertion loss characteristics and attenuation characteristics of the film bulk acoustic resonator.

A cross section of the support part 133 has an approximately trapezoidal shape. In detail, a width of an upper surface of the support part 133 is greater than a width of a lower surface of the support part 133, and side surfaces of the support part 133 connecting the upper surface and the lower surface to each other are inclined. The support part 133 may be formed of a material that is not etched in an etching process for removing the sacrificial layer. As an example, the support part 133 is formed of the same material as that of the etch stop layer, and is formed of either one of a silicon dioxide ($SiO_2$) and a silicon nitride ($Si_3N_4$).

The auxiliary support part 134 is provided outside the support part 133, that is, at an opposite side of the support part 133 with respect to the air cavity 112. The auxiliary support part 134 may be formed of the same material as that of the support part 133 or may be formed of a material different from that of the support part 133. As an example, in a case in which the auxiliary support part 134 is formed of the material different from that of the support part 133, the auxiliary support part 134 is a portion of the sacrificial layer, which is formed on the etch stop layer, that remains after the etching process in the sacrificial layer.

Figure 3A:
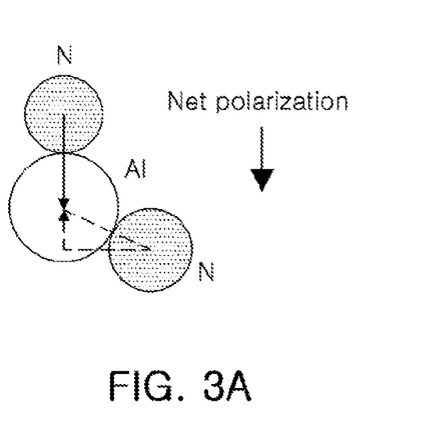
FIG. 3A is a schematic view illustrating an element bond of an aluminum nitride.
Figure 3B:
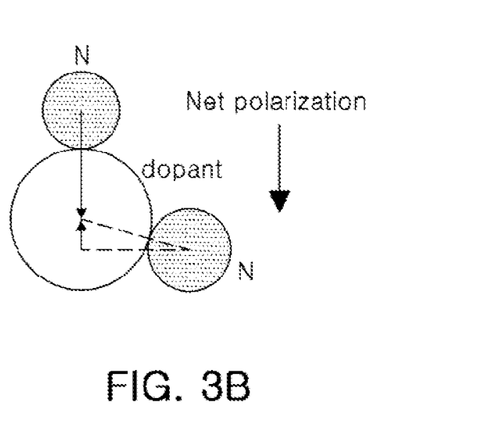
FIG. 3B is a schematic view illustrating an element of a nitrided dopant in a case in which a piezoelectric body of the film bulk acoustic resonator, according to an embodiment, includes a dopant.

FIG. 3A is a schematic view illustrating an element bond of an aluminum nitride. FIG. 3B is a schematic view illustrating an element of a nitrided dopant nitride in a case in which the piezoelectric body 150 of the film bulk acoustic resonator 1/100, according to an embodiment, includes a dopant.

Referring to FIGS. 3A and 3B, it can be appreciated that net polarization is increased in a case in which a dopant having an element diameter greater than that of Al is added to AlN.

In addition, lattice distortion becomes larger in the case in which the dopant having the element diameter greater than that of Al is added to AlN than in a case in which only AlN is used as a material of a piezoelectric body. As a result, ionic displacement is increased, such that piezoelectric characteristics of the piezoelectric body are improved.

Table 1 indicates whether various elements that may be used as a dopant of AlN used as a material of the piezoelectric body of the film bulk acoustic resonator 10/100 can be bonded to nitrogen, structures of nitrides of the various elements, whether the various elements can be doped to the aluminum nitride, and element diameters of the respective elements. In Table 1, "○" indicates that an element is well suited for bonding with nitrogen/use as a dopant to AlN, "Δ" indicates that an element is marginally suitable for bonding with nitrogen/use as a dopant to AlN, and "x" indicates that an element cannot be bonded with nitrogen or used as a dopant to AlN.

TABLE 1

| | Whether Element may be bonded to Nitrogen | Whether Element may be doped to Aluminum Nitride | Structure of Nitride of Element | Element Diameter (Å) |
|---|---|---|---|---|
| Ru | ○ | X | — | 1.34 |
| Mo | ○ | X | — | 1.39 |
| Ir | Δ | X | — | 1.36 |
| W | ○ | X | — | 1.39 |
| Ta | ○ | ○ | Rock Salt | 1.46 |
| Pt | Δ | X | — | 1.39 |
| Au | ○ | X | — | 1.44 |
| Ni | ○ | ○ | Nitrate | 1.24 |
| Cr | ○ | ○ | Rock Salt | 1.28 |
| Cu | ○ | X | — | 1.28 |
| Nb | ○ | ○ | Rock Salt | 1.46 |
| V | ○ | ○ | Rock Salt | 1.34 |
| Mn | Δ | ○ | Nitrate | 1.27 |
| Co | Δ | ○ | Nitrate | 1.25 |
| Zn | ○ | ○ | $Zn_3N_2$ Cubic | 1.34 |
| Re | ○ | ○ | $Re_3N$ HCP | 1.37 |

Elements that can be added as the dopant of the piezoelectric body including AlN instead of a rare earth metal will be classified with reference to Table 1.

As illustrated in FIGS. 3A and 3B, the element diameter of the dopant added in order to improve the piezoelectric characteristics of the piezoelectric body 150 needs to be greater than 1.43 Å, which is the element diameter of Al. That is, in a case in which the element diameter of the dopant is greater than that of Al, the net polarization is increased, and the lattice distortion becomes large. As a result, the ionic displacement is increased, such that the piezoelectric characteristics of the piezoelectric body 150 are improved. In addition, the elements need to be able to be bonded to nitrogen and to be added as the dopant to AlN.

It can be confirmed that Ta and Nb can be coupled to nitrogen, can be doped to the aluminum nitride, and have an element diameter greater than that of Al among various elements mentioned in Table 1.

Therefore, the film bulk acoustic resonator 1/100 may include Ta or Nb as the dopant added to the piezoelectric body 150 including AlN.

In a case in which the dopant is Ta, the piezoelectric body 150 may include AlN and AlTaN. In addition, in a case in which the dopant is Nb, the piezoelectric body 150 may include AlN and AlNbN.

For example, the piezoelectric body 150 is formed by sputtering a single target including AlTa or a single target including AlNb under a nitrogen atmosphere as described below. Therefore, TaN or NbN, which is a factor deteriorating the piezoelectric characteristics, is not included in the piezoelectric body.

Here, the statement that TaN or NbN is not included in the piezoelectric body means that the piezoelectric body includes only AlN or AlTaN in the case in which the dopant is Ta or includes only AlN and AlNbN in the case in which the dopant is Nb, and that TaN or NbN does not exist beyond an error range in the piezoelectric body 150. The error range refers to a range in which impurities other than a target material are inevitably included in the piezoelectric body 150 in a process of manufacturing the piezoelectric body 150. TaN or NbN may exist within an error range, for example, in a case in which TaN or NbN is not detected at the time of an x-ray diffraction (XRD) analysis of doped AlTaN or AlNbN.

A content of Ta included in the piezoelectric body 150 may be 0.1 to 24 at %. In a case in which the content of Ta is less than 0.1 at %, there may not be substantial improvement of the piezoelectric characteristics of the piezoelectric body 150. Since an atomic weight of Ta is greater than that of Al, in a case in which the content of Ta exceeds 24 at %, a phase other than Al$_3$Ta may be formed. That is, in a case in which the content of Ta exceeds 24 at %, the piezoelectric body 150 may not be uniformly formed at the time of being formed.

In addition, in a case in which the atomic weight of Ta exceeds 13 at %, a content (wt %) of Ta included in the piezoelectric body 150 may be greater than a content (wt %) of Al on the basis of wt %. Therefore, TaN that does not have an influence on improvement of the piezoelectric characteristics may be formed, such that the piezoelectric characteristics of the piezoelectric body 150 may be deteriorated. That is, in the case in which the dopant is Ta, the content (wt %) of Ta included in the piezoelectric body 150 may be less than the content (wt %) of Al included in the piezoelectric body 150. In addition, in a case in which the content (wt %) of Ta is greater than the content (wt %) of Al, a problem such as phase separation of Al and Ta may occur at the time of manufacturing a single target, such that it may be difficult to manufacture the target.

Therefore, in the film bulk acoustic resonator 10/100, in a case in which the dopant added to the piezoelectric body 150 is Ta, the content of Ta may be 0.1 to 24 at % to improve the piezoelectric characteristics of the piezoelectric body 150. In a case in which the content of Ta is 0.1 to 13 at %, the piezoelectric characteristics of the piezoelectric body 150 may be stably improved.

A content of Nb included in the piezoelectric body 150 may be 0.1 to 23 at %. In a case in which the content of Nb is less than 0.1 at %, there may not be substantial improvement of the piezoelectric characteristics of the piezoelectric body 150. Since an atomic weight of Nb is greater than that of Al, in a case in which the content of Nb exceeds 23 at %, a content (wt %) of Nb included in the piezoelectric body 150 may be greater than a content (wt %) of Al on the basis of wt %. Therefore, NbN that does not have an influence on improvement of the piezoelectric characteristics may be formed, such that the piezoelectric characteristics of the piezoelectric body 150 may be deteriorated. That is, in the case in which the dopant is Nb, the content (wt %) of Nb included in the piezoelectric body 150 may be less than the content (wt %) of Al included in the piezoelectric body 150. In addition, in a case in which the content of Nb is greater than the content of Al, a problem such as phase separation of Al and Nb may occur at the time of manufacturing a single target, such that it may be difficult to manufacture the target.

Therefore, in the film bulk acoustic resonator 10/100, in a case in which the dopant added to the piezoelectric body 150 is Nb, the content of Nb may be 0.1 to 23 at % to improve the piezoelectric characteristics of the piezoelectric body 150.

For example, the film bulk acoustic resonator 10/100 includes only one element as the dopant added to the piezoelectric body 150.

In a case in which two or more dopants are used, it may be difficult to adjust the two or more dopants to form a desired composition, and composition uniformity of a deposited thin film may become poor. In addition, in a case in which a single target including two or more dopants is manufactured, it may be difficult to manufacture a single target having an accurate and uniform composition.

The first electrode 140 and the second electrode 160 may include molybdenum (Mo) as a conductive metal. However, the conductive metal included in each of the first electrode 140 and the second electrode 160 is not limited to Mo, but may be, for example, any one of gold (Au), titanium (Ti), tantalum (Ta), molybdenum (Mo), ruthenium (Ru), platinum (Pt), tungsten (W), aluminum (Al), nickel (Ni), and Iridium (Ir), or alloys thereof.

Table 2 represents material consistency depending on compositions of the first and second electrodes 140 and 160, and the piezoelectric layer 150. In Table 2, in relative relationship, "x" indicates low consistency, "○" indicates medium consistency, and "⊚" indicates high consistency.

TABLE 2

|  | First Electrode | Piezoelectric Layer | Second Electrode | Material Consistency |
| --- | --- | --- | --- | --- |
| Comparative Example 1 | Mo | AlN | Mo | ○ |
| Comparative Example 2 | Mo | AlTaN | Mo | X |
| Disclosed Example 1 | MoTa | AlTaN | MoTa | ⊚ |
| Disclosed Example 2 | MoNb | AlTaN | MoNb | ○ |
| Comparative Example 3 | Mo | AlNbN | Mo | X |
| Disclosed Example 3 | MoNb | AlNbN | MoNb | ⊚ |
| Disclosed Example 4 | MoTa | AlNbN | MoTa | ○ |

Referring to Table 2, in a case (Disclosed Examples 1 and 2) in which Ta is added as the dopant to the piezoelectric body 150, the first electrode 140 or the second electrode 160 includes Ta or Nb as an added element. In addition, in a case (Disclosed Examples 3 and 4) in which Nb is added as the dopant to the piezoelectric body 150, the first electrode 140 or the second electrode 160 includes Nb or Ta as an added element.

In this case, contents of Nb and Ta added to the first electrode 140 or the second electrode 160 may be 0.1 to 30 at % or less.

Since the first electrode 140 or the second electrode 160 includes the dopant included in the piezoelectric body 150 as an added element, bondability and crystal alignment depending on material consistency between the piezoelectric body 150 and the first or second electrode 140 or 160 is increased.

In order to further improve the material consistency between the piezoelectric body 150 and the first or second electrode 140 or 160, the first electrode 140 or the second electrode 160 of the film bulk acoustic resonator 10/100 may include the same element as the dopant included in the piezoelectric body 150 as an added element (Inventive Examples 1 and 3).

Filter

Figure 4:
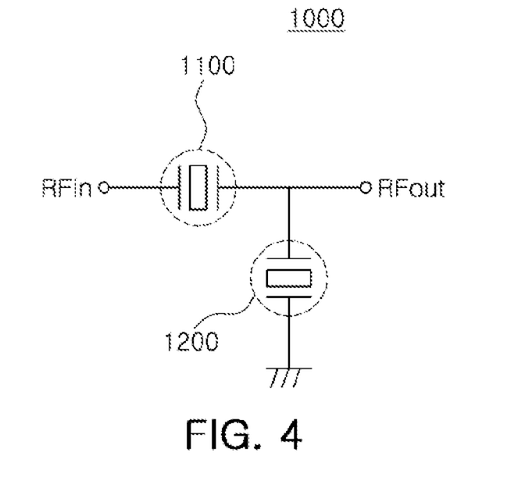
FIGS. 4 and 5 are schematic circuit diagrams of filters, according to embodiments.
Figure 5:
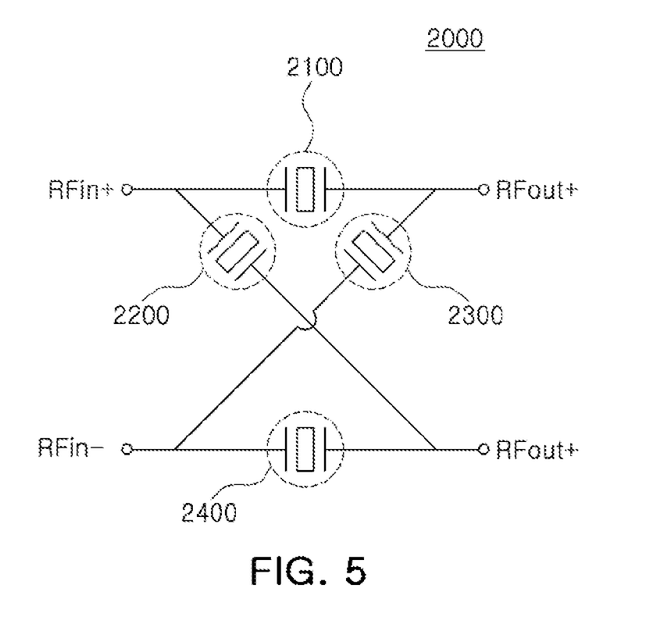

FIGS. 4 and 5 are schematic circuit diagrams of filters 1000 and 2000, according to embodiments. Each of first and second film bulk acoustic resonators 1100 and 1200 in the filter 1000 and each of first through fourth film bulk acoustic resonators 2100, 2200, 2300, and 2400 in the filter 2000 may correspond to the film bulk acoustic resonator 1 or 100 illustrated in FIG. 1A or 1B.

Referring to FIG. 4, the filter 1000 is formed in a ladder-type filter structure. In detail, the filter 1000 includes the film bulk acoustic resonators 1100 and 1200. The first film bulk acoustic resonator 1100 is connected between a signal input terminal to which an input signal RFin is input and a signal output terminal from which an output signal RFout is output, in series, and the second film bulk acoustic resonator 1200 is connected between the signal output terminal and a ground.

Referring to FIG. 5, the filter 2000 is formed in a lattice type filter structure. In detail, the filter 2000 includes the first, second, third, and fourth bulk acoustic resonators 2100, 2200, 2300, and 2400, and filters balanced input signals RFin+ and RFin− and output balanced output signals RFout+ and RFout−.

Method of Manufacturing Film Bulk Acoustic Resonator

Figure 6:
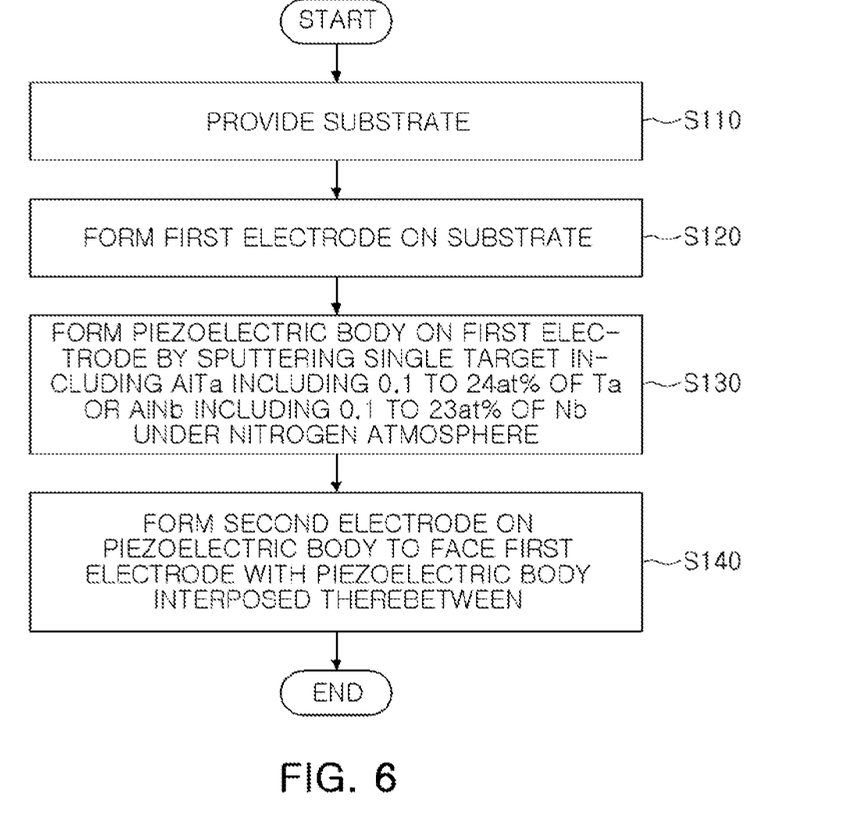
FIG. 6 is a schematic flow chart illustrating a method of manufacturing a film bulk acoustic resonator, according to an embodiment.

FIG. 6 is a schematic flow chart illustrating a method of manufacturing the film bulk acoustic resonator 1/100, according to an embodiment.

For clarity of explanation, in the method of manufacturing the film bulk acoustic resonator 10/100, processes of forming the first and second electrodes 140 and 160, and the piezoelectric body 150 will be mainly described with reference to FIGS. 1A and 2, and processes of manufacturing other components may be similar to corresponding processes of a method of manufacturing a film bulk acoustic resonator generally used in the related art.

Referring to FIG. 6, the method of manufacturing the film bulk acoustic resonator 10/100 includes providing the substrate in operation S110, forming the first electrode on the substrate in operation S120, forming the piezoelectric body 150 on the first electrode 140 by sputtering the single target including AlTa including 0.1 to 24 at % of Ta or AlNb including 0.1 to 23 at % of Nb under the nitrogen atmosphere in operation S130, and forming the second electrode 160 on the piezoelectric body 150 to face the first electrode 140 so that the piezoelectric body 150 is interposed between the first and second electrodes 140 and 160.

First, the substrate is provided in operation S110. The substrate 110 may be the silicon substrate. After the substrate 110 is provided, the insulating layer 120 is provided on the upper surface of the substrate 110 to electrically isolate the substrate 110 and the resonant part 135 from each other.

The insulating layer 120 may be manufactured by forming any one of silicon dioxide (SiO$_2$), silicon nitride (Si$_3$N$_4$), aluminum oxide (Al$_2$O$_3$), and aluminum nitride (AlN) on the substrate 110 by any one of a chemical vapor deposition process, an RF magnetron sputtering process, and an evaporation process.

After the insulating layer 120 is formed, the air cavity 112 is formed. The air cavity 112 is positioned below the resonant part 135 so that the resonant part 135 can vibrate in the predetermined direction. The air cavity 112 is formed by forming an air cavity sacrificial layer pattern on the insulating layer 120, forming the membrane 130 on the air cavity sacrificial layer pattern, and then etching and removing the air cavity sacrificial layer pattern by an etching process. The membrane 130 is the oxidation protecting film, is the protecting layer protecting the substrate 110. The membrane 130 is formed of any one or any combination of any two or more of SiO$_2$, Si$_3$N$_4$, AlN, and Al$_2$O$_3$. Although not illustrated in FIGS. 1A and 1B, the seed layer formed of an aluminum nitride (AlN) is formed on the membrane 130. For example, the seed layer is disposed between the membrane 130 and the first electrode 140. The seed layer is also formed using a dielectric material or a metal having a HCP structure, in addition to AlN. In a case in which the seed layer is formed of the metal, the seed layer is formed of Ti, for example.

Although not illustrated in FIGS. 1A and 1B, the etch stop layer may be additionally formed on the insulating layer 120. The etch stop layer protects the substrate 110 and the insulating layer 120 from the etching process for removing the sacrificial layer pattern, and is a base for depositing several other layers on the etch stop layer.

After the providing the substrate 110 in operation S110, as described above, the first electrode 140 is formed on the substrate 110 in operation S120.

Figure 9:
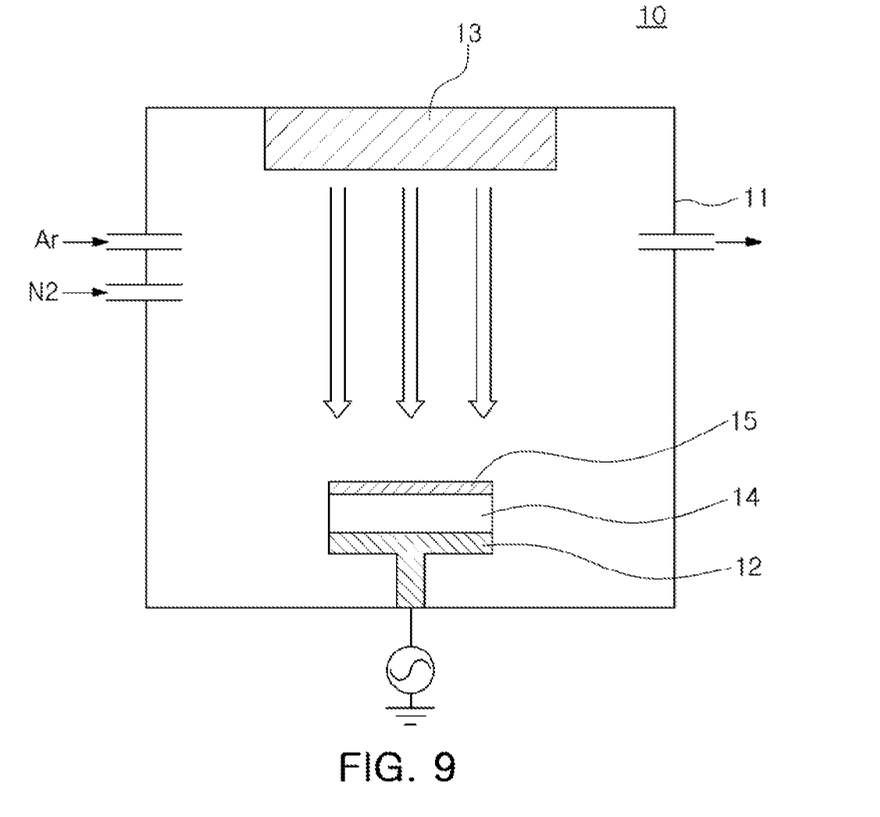
FIG. 9 is a schematic view illustrating a sputtering apparatus of a single target used in the method of manufacturing a film bulk acoustic resonator, according to an embodiment.

The first electrode 140, the piezoelectric body 150 and the second electrode 160 are formed by reactive sputtering using a sputtering apparatus 10 illustrated in FIG. 9.

Referring to FIG. 9, the sputtering apparatus 10 includes a chamber 11, a support member 12, and a target 13. A basic member 14, which is a base of a material to be grown, is disposed on the support member 12, and as a sputtering process is performed, the material to be grown is deposited on the basic member 14, such that a forming layer 15 is grown. Argon (Ar) and nitrogen (N$_2$) are injected into the chamber 11 to adjust an atmosphere in the chamber 11 in a process of growing the first electrode 140, the piezoelectric body 150, and the second electrode 160.

The first electrode 140 may be formed in operation S120 using molybdenum (Mo), which is a conductive metal, as the target 13. However, the first electrode 140 is not limited to being formed of molybdenum, and may be formed of any one of gold (Au), titanium (Ti), tantalum (Ta), molybdenum (Mo), ruthenium (Ru), platinum (Pt), tungsten (W), aluminum (Al), nickel (Ni), and Iridium (Ir), or alloys thereof, which are conductive metals.

In addition, the first electrode 140 further includes Ta or Nb as an added element, such that material consistency between the piezoelectric body 150 and the first electrode 140 is improved. Therefore, formation of abnormal crystals in the piezoelectric body 150 during the forming of the piezoelectric body 150 in operation S130 may be prevented, such that the piezoelectric characteristics of the piezoelectric body 150 are improved.

In addition, MoTa and MoNb have a surface oxidation preventing effect as compared to pure Mo, a molybdenum oxide film (MoO$_x$) may not be formed well. Therefore, crystal alignment may be improved in the forming of the piezoelectric body 150.

For example, in a case in which the piezoelectric body 150 is formed of the single target including AlTa, the first electrode 140 may include Ta, and in the case in which the piezoelectric body 150 is formed of the single target including AlNb, the first electrode 140 also includes Nb, such that the material consistency between the piezoelectric body 150 and the first electrode 140 is significantly improved.

Referring to FIG. 6, next, the piezoelectric body 150 is formed on the first electrode 140 in operation S130. As described above, the piezoelectric body 150 may be formed by the reactive sputtering using the sputtering apparatus 10 illustrated in FIG. 9. For example, in the forming of the piezoelectric body 150 in operation S130, the target 13 is a single target. The single target refers to one target 13 in which all the elements to be formed in the forming layer 15 are included.

The film bulk acoustic resonator 1/100 includes Ta or Nb as the dopant added to the piezoelectric body 150 including AlN. To this end, the single target includes AlTa or AlNb. The single target including AlTa or the single target including AlNb may be manufactured by a melting method, or may be manufactured by a powder sintering method.

In a case in which the single target including AlTa is used, a content of Ta included in the single target may be 0.1 to 24 at %. Referring to of FIG. 7, it can be appreciated that a single Al$_3$Ta phase is formed in a case (see "a" of FIG. 7) in which the content of Ta included in the single target including AlTa is 0.1 to 24 at %. That is, in the case in which the content of Ta included in the single target is 0.1 to 24 at %, the single target having the single phase is provided, and the piezoelectric body 150 is formed to have a uniform composition using the single target having the single phase.

Figure 7:
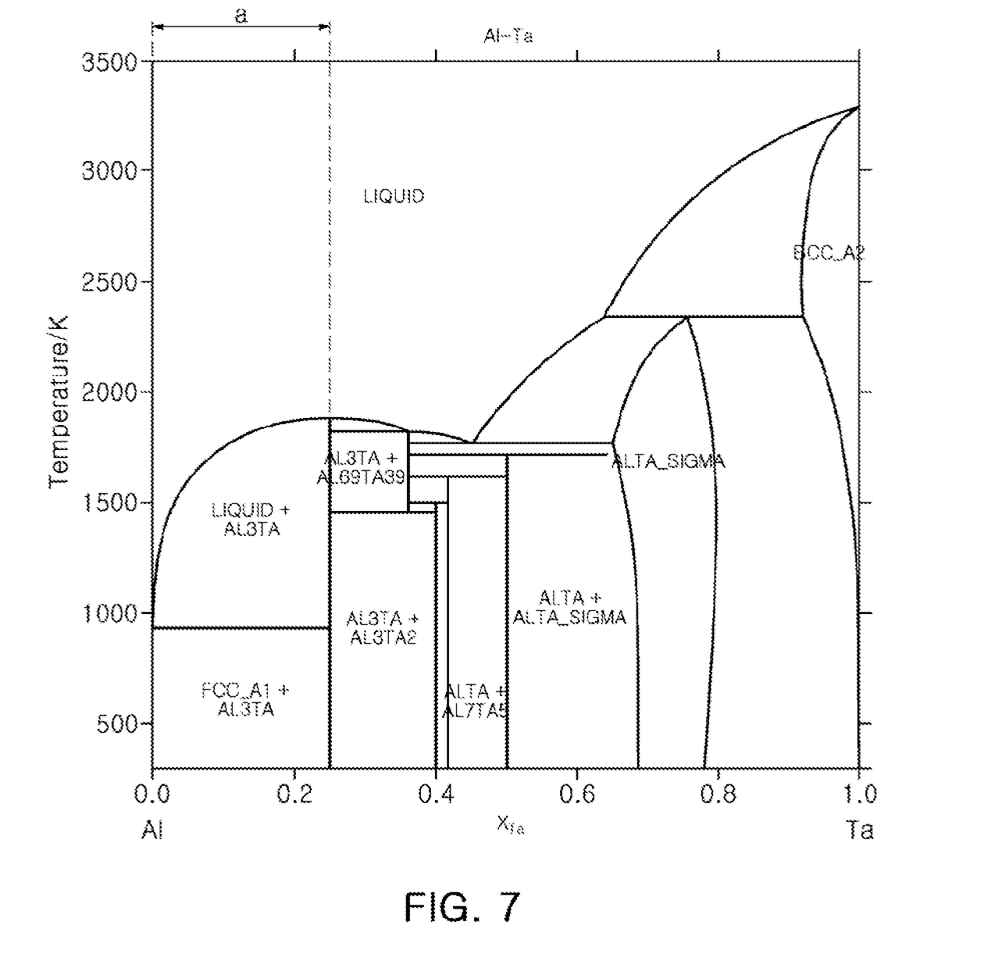
FIG. 7 is a schematic state diagram of Al—Ta.

That is, in the case in which the content of Ta included in the single target including AlTa is 0.1 to 24 at %, the single Al$_3$Ta phase is formed, such that AlN and AlTaN is uniformly formed in a process of growing the piezoelectric body 150. In a case in which the content of Ta is less than 0.1 at %, improvement of the piezoelectric characteristics of the piezoelectric body 150 are slight, and in a case in which the content of Ta exceeds 24 at %, the single target including AlTa is not the single Al$_3$Ta phase, and TaN is thus formed in the process of growing the piezoelectric body 150, such that the piezoelectric characteristics of the piezoelectric body are deteriorated. Therefore, a condition in which the content of Ta included in the single target including AlTa is 0.1 to 24 at % is satisfied, such that uniformity in growth of the piezoelectric body 150 is improved and piezoelectric characteristics of the film bulk acoustic resonator are improved.

However, since an atomic weight of Ta is greater than that of Al, in a case in which the content of Ta exceeds 13 at %, a content (wt %) of Ta included in the piezoelectric body 150 is greater than a content (wt %) of Al on the basis of wt %. Therefore, TaN that does not have an influence on improvement of the piezoelectric characteristics is formed, such that the piezoelectric characteristics of the piezoelectric body 150 are deteriorated. Therefore, in a case in which the content of Ta is 0.1 to 13 at %, the piezoelectric characteristics of the piezoelectric body 150 are stably improved.

Figure 8:
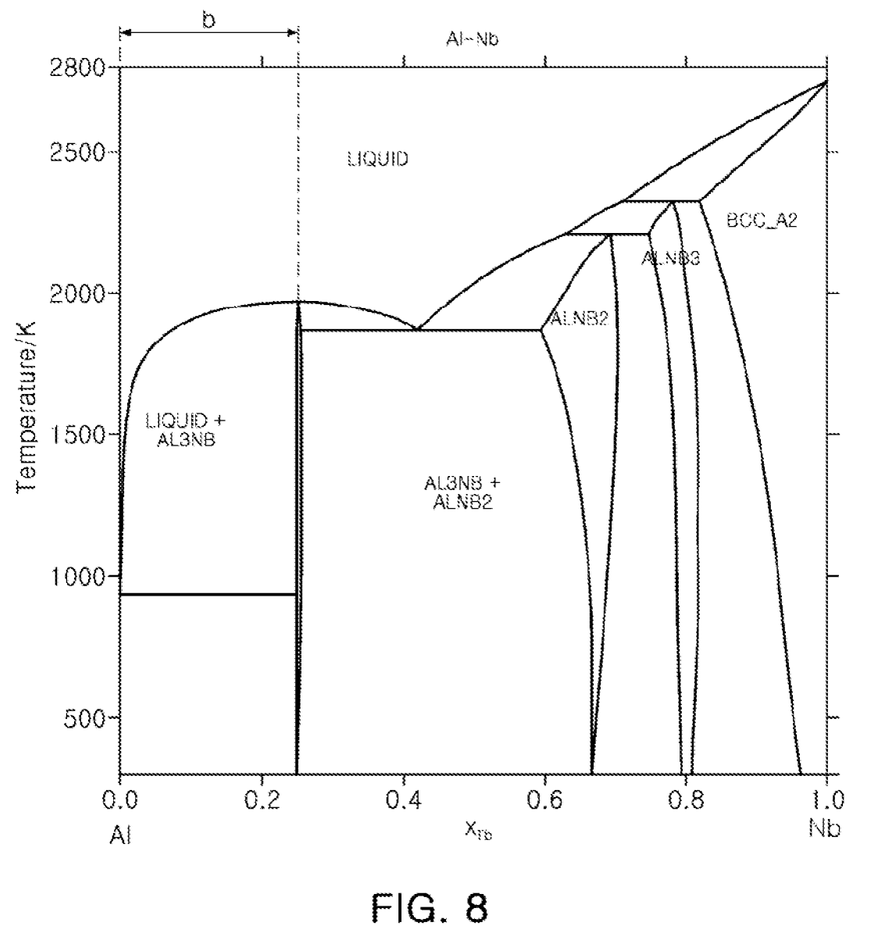
FIG. 8 is a schematic state diagram of Al—Nb.

Referring to a state diagram of Al—Nb of FIG. 8, it can be appreciated that a single Al$_3$Nb phase is formed in a case (see "b" of FIG. 8) in which a content of Nb included in the single target including AlNb is 0.1 to 23 at %. That is, in the case in which the content of Nb included in the single target including AlNb is 0.1 to 23 at %, the single Al$_3$Nb phase is formed, such that AlN and AlNbN is uniformly formed in a process of growing the piezoelectric body 150. In a case in which the content of Nb is less than 0.1 at %, improvement of the piezoelectric characteristics of the piezoelectric body 150 are slight, and in a case in which the content of Nb exceeds 23 at %, the single target including AlNb is not the single Al$_3$Nb phase, and NbN is thus formed in the process of growing the piezoelectric body 150, such that the piezoelectric characteristics of the piezoelectric body 150 are deteriorated. Particularly, since an atomic weight of Nb is greater than that of Al, in a case in which the content of Nb exceeds 23 at %, a content (wt %) of Nb included in the piezoelectric body 150 is greater than a content (wt %) of Al on the basis of wt %. Therefore, NbN that does not have an influence on improvement of the piezoelectric characteristics is formed, such that the piezoelectric characteristics of the piezoelectric body 150 are deteriorated.

Therefore, a condition in which the content of Nb included in the single target including AlNb is 0.1 to 23 at % is satisfied, such that uniformity in growth of the piezoelectric body 150 is improved and piezoelectric characteristics of the film bulk acoustic resonator 1/100 are improved.

The single target including AlTa or the single target including AlNb, manufactured as described above are disposed at the target 13 of the sputtering apparatus 10 of FIG. 9 and are then grown under a nitrogen atmosphere to form the piezoelectric body 150.

Figure 10A:
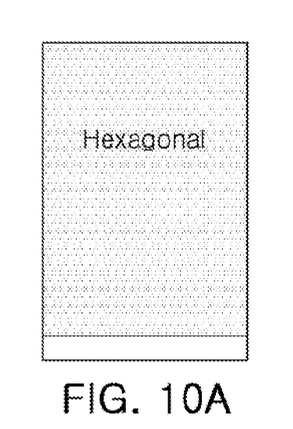
FIG. 10A is a view illustrating a measuring result of a crystal structure when a piezoelectric body is formed using a single target including AlTa or a single target including AlNb, according to an embodiment.
Figure 10B:
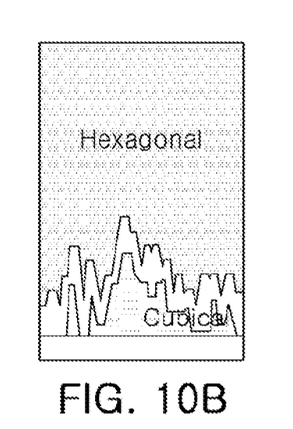
FIG. 10B is a view illustrating a measuring result of a crystal structure in a case in which a piezoelectric body is formed using a dual target including Al and Ta or a dual target including Al and Nb, according to an embodiment.

FIG. 10A is a view illustrating a measuring result of a crystal structure when a piezoelectric body is formed using a single target including AlTa or a single target including AlNb. FIG. 10B is a view illustrating a measuring result of a crystal structure in a case in which a piezoelectric body is formed using a dual target including Al and Ta or a dual target including Al and Nb.

When comparing FIGS. 10A and 10B, it can be appreciated that, as shown in FIG. 10B, a cubical structure as well as a hexagonal structure is observed in the case in which the piezoelectric body is formed using the dual target including Al and Ta or the dual target including Al and Nb. Such a cubical structure does not have piezoelectric characteristics and therefore causes deterioration of piezoelectric characteristics of the piezoelectric body.

However, as illustrated in FIG. 10A, in the method of manufacturing a film bulk acoustic resonator according to an embodiment of this disclosure, the piezoelectric body is formed using the single target including AlTa or the single target including AlNb, and formation of the cubical structure beyond an error range is thereby prevented, such that the piezoelectric characteristics of the piezoelectric body are improved.

Referring to FIG. 6, finally, the second electrode 160 is formed on the piezoelectric body 150 in operation S140.

The second electrode 160 is formed by the reactive sputtering using the sputtering apparatus 10 illustrated in FIG. 9.

The forming of the second electrode 160 is performed using molybdenum (Mo), which is a conductive metal, as the target 13. However, the second electrode 160 is not limited to being formed of molybdenum, and may be formed of any one of gold (Au), titanium (Ti), tantalum (Ta), molybdenum (Mo), ruthenium (Ru), platinum (Pt), tungsten (W), aluminum (Al), nickel (Ni), and Iridium (Ir), or alloys thereof, which are conductive metals.

In addition, the second electrode 160 further includes Ta or Nb as an added element, such that material consistency between the piezoelectric body 150 and the second electrode 160 is improved. Therefore, the second electrode 160 is more uniformly formed to improve the piezoelectric characteristics of the film bulk acoustic resonator 1/100.

Particularly, in a case in which the piezoelectric body 150 is formed of the single target including AlTa, the second electrode 160 also includes Ta, and in the case in which the piezoelectric body 150 is formed of the single target including AlNb, the second electrode 160 also includes Nb, such that the material consistency between the piezoelectric body 150 and the second electrode 160 is significantly improved.

Then, the protecting layer 170 and the electrode pads 180 are appropriately formed to complete the film bulk acoustic resonator 1/100.

As set forth above, the piezoelectric body 150 of the film bulk acoustic resonator 1/100, according to embodiments, includes 0.1 to 24 at % of Ta or 0.1 to 23 at % of Nb as the dopant added to AlN to have piezoelectric characteristics equal to or better than those of a piezoelectric body in which a rare earth metal is used as a dopant.

In addition, the single target is used to overcome composition non-uniformity of AlTaN or AlNbN.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A film bulk acoustic resonator, comprising:
   a first electrode disposed on a substrate;
   a piezoelectric body disposed on the first electrode and comprising AlN to which a dopant is added; and
   a second electrode disposed on the piezoelectric body and facing the first electrode such that the piezoelectric body is interposed between the second electrode and the first electrode,
   wherein the dopant comprises either one of 0.1 to 24 atomic % of TA (tantalum) and 0.1 to 23 atomic % of Nb (niobium).

2. The film bulk acoustic resonator of claim 1, wherein a weight percent content of either one of Ta (tantalum), and Nb (niobium) in the piezoelectric body is less than a weight percent content of Al in the piezoelectric body.

3. The film bulk acoustic resonator of claim 1, wherein
   in a case in which the dopant comprises Ta (tantalum), the piezoelectric body comprises AlN and AlTaN (aluminum tantalum nitride), or
   in a case in which the dopant comprises Nb (niobium), the piezoelectric body comprises AlN and AlNbN (aluminum tantalum nitride).

4. The film bulk acoustic resonator of claim 1, wherein the piezoelectric body does not include either one of TaN (tantalum nitride) and NbN (niobium nitride).

5. The film bulk acoustic resonator of claim 1, wherein either one of the first electrode and the second electrode comprises a conductive metal and an added element, and wherein the added element comprises either one of Ta (tantalum) and Nb (niobium.

6. The film bulk acoustic resonator of claim 5, wherein the added element is the same as the dopant.

7. The film bulk acoustic resonator of claim 1, wherein either one of the first electrode and the second electrode comprises a conductive metal and an added element, and wherein the added element comprises either one of Ta (tantalum) and (niobium) in an amount of 0.1 to 30 atomic %.

* * * * *